United States Patent
Hong

(10) Patent No.: US 6,839,011 B1
(45) Date of Patent: Jan. 4, 2005

(54) SYSTEM AND METHOD OF FILTERING IN AN INTEGRATION SYSTEM

(75) Inventor: Merit Hong, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/403,678

(22) Filed: Mar. 31, 2003

(51) Int. Cl.[7] .............................................. H03M 3/00
(52) U.S. Cl. .................................... 341/143; 341/172
(58) Field of Search ................................ 341/143, 172

(56) References Cited

U.S. PATENT DOCUMENTS

| | | | | |
|---|---|---|---|---|
| 5,134,401 A | * | 7/1992 | McCartney et al. | 341/143 |
| 5,243,345 A | | 9/1993 | Naus et al. | |
| 5,917,440 A | * | 6/1999 | Khoury | 341/143 |
| 6,037,887 A | * | 3/2000 | Wu et al. | 341/143 |
| 6,140,950 A | * | 10/2000 | Oprescu | 341/143 |

OTHER PUBLICATIONS

Friedel Gerfers et al., Implementation of a 1.5V Low–Power Clock–Jitter Insensitive Continuous–Time Modulator, IEEE, 0–7803–7448–7/02, pp. 652–655. Jul. 2002.

* cited by examiner

*Primary Examiner*—Howard Williams
(74) *Attorney, Agent, or Firm*—Toler, Larson & Abel, LLP

(57) ABSTRACT

An improved method of filtering that can be used with an analog-to-digital converter (ADC) is disclosed herein. Multiple discrete-time-feedback-modules (114, 116) each with current limiting (202, 204 and 222, 224) are used to sample information which is supplied to an integrator (112) for conversion to digital form. By overlapping the integration of these samples, and by evaluating these integration results multiple times (TP2, TP3, TP4) per sample (TP1), using the methods disclosed herein the advantages of increased accuracy, lower power consumption and reduced cost may be realized.

27 Claims, 5 Drawing Sheets

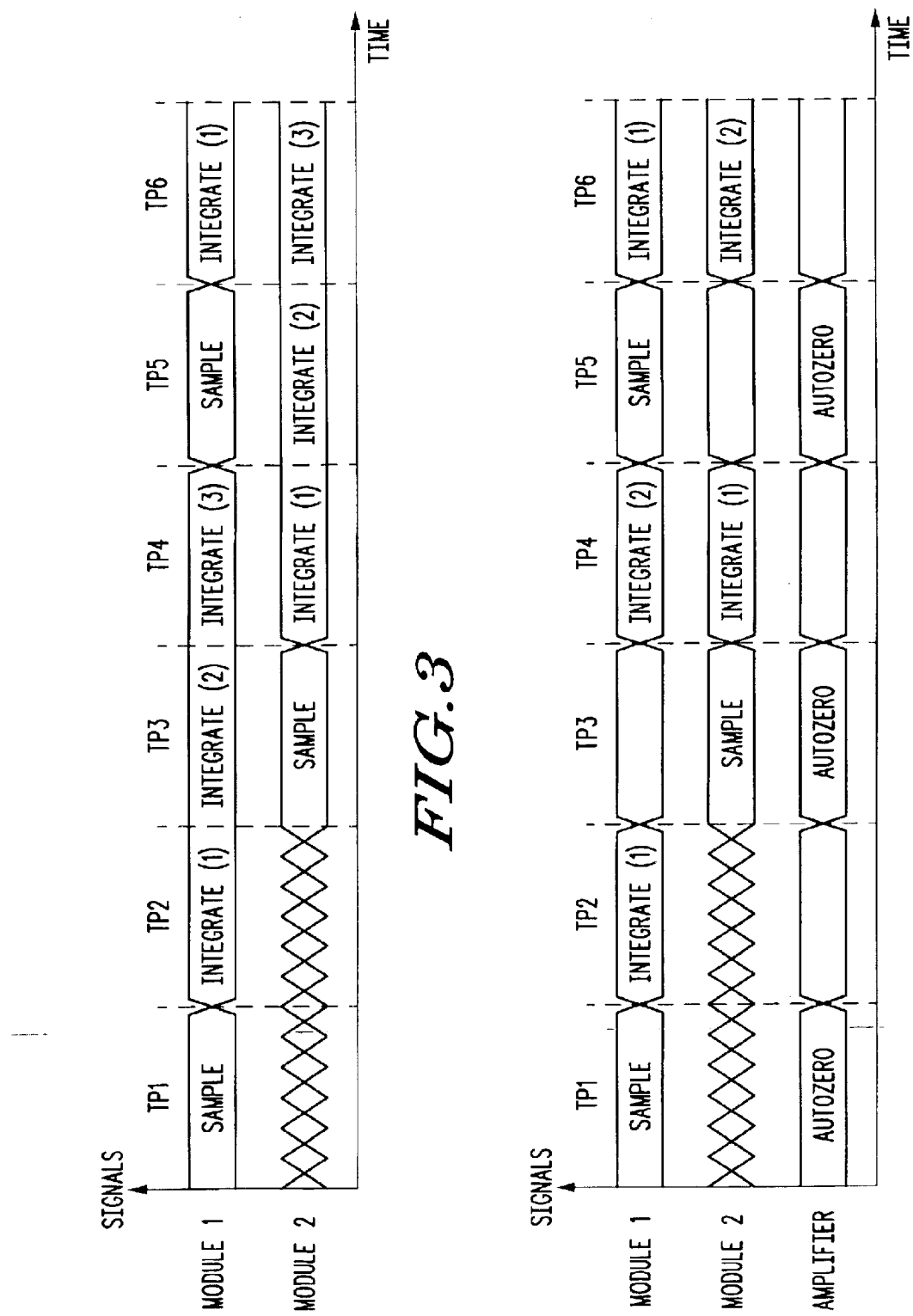

US 6,839,011 B1

SYSTEM AND METHOD OF FILTERING IN AN INTEGRATION SYSTEM

FIELD OF THE DISCLOSURE

The present disclosure relates generally to filtering, and more specifically to filtering using discrete time feed-back.

BACKGROUND

There are at least three issues to be considered when designing an analog-to-digital converter (ADC): cost, accuracy and power consumption. For a monolithic silicon ADC the cost is primarily a function of the physical size of the converter. Smaller designs permit more devices to be processed using a given amount of resources, and the yields are typically higher since there is less overall area in which defects may be located. The higher yields in the manufacturing process further translate to lower cost.

The accuracy of an ADC is specified by the system in which it is to be used, and may be expressed in terms of a signal to noise ratio and overall resolution. Signal to noise describes the amount of desired signal present in the output compared to the undesired noise. This noise can distort the true signal and cause erroneous information to be output. As greater amounts of noise get included in the signal, the output becomes less accurate. Reduction of the noise component in the output of an ADC is a desirable design consideration.

Power consumption is another factor in the design of an ADC, particularly for portable or mobile devices which are battery powered. The less power used by portable or mobile devices the better since it extends the length of time the device may be operated before charging is required. Often however, reduced power consumption causes other parameters such as accuracy to degrade. Optimizing a design so that it consumes less power without losing accuracy is desirable.

One type of ADC is a Sigma-Delta ADC. During normal operation, a Sigma-Delta ADC with discrete-time sampling will sample an analog signal during a sample phase by storing a charge onto a capacitor. This charge is then integrated onto an integrator during an integration phase. Because the settling, or discharge, of discrete time signals, such as the sampled charge during integration, is an exponential RC decay, designing an operational amplifier capable of driving the peak current of the exponential decay (which is needed for only a brief instant) is wasteful. Therefore, operational amplifiers in discrete-time integrators have outputs which are sometimes limited relative to their input. As a result during peak current loads the output will not proportionately track the input. This skewing of the output gives power-efficient integration of discrete-time signals, but the result is a non-linear integration of continuous-time signals. A design which overcomes these limitations would be advantageous.

BRIEF DESCRIPTION OF THE DRAWINGS

Various advantages, features and characteristics of the present disclosure as well as methods, operation, and functions of related elements of structure, and the combination of parts and economies of manufacture, will become apparent upon consideration of the following description and claims with reference to the accompanying drawings, all of which form a part of this specification.

FIGS. 3–6 are timing diagrams, according to various embodiments of the present disclosure.

DETAILED DESCRIPTION OF THE DRAWINGS

Figure 1:
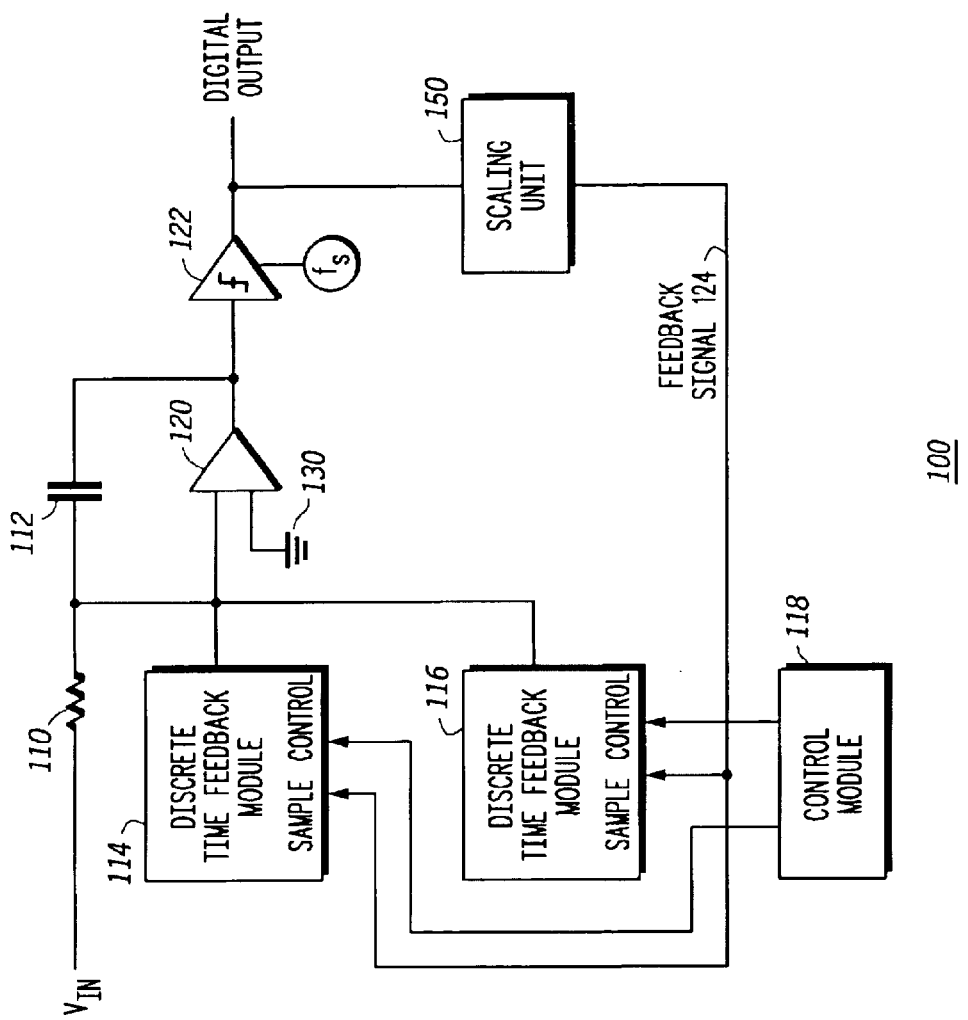
FIG. 1 shows a block diagram of a Sigma-Delta ADC according to one embodiment of the present disclosure.
Figure 2:
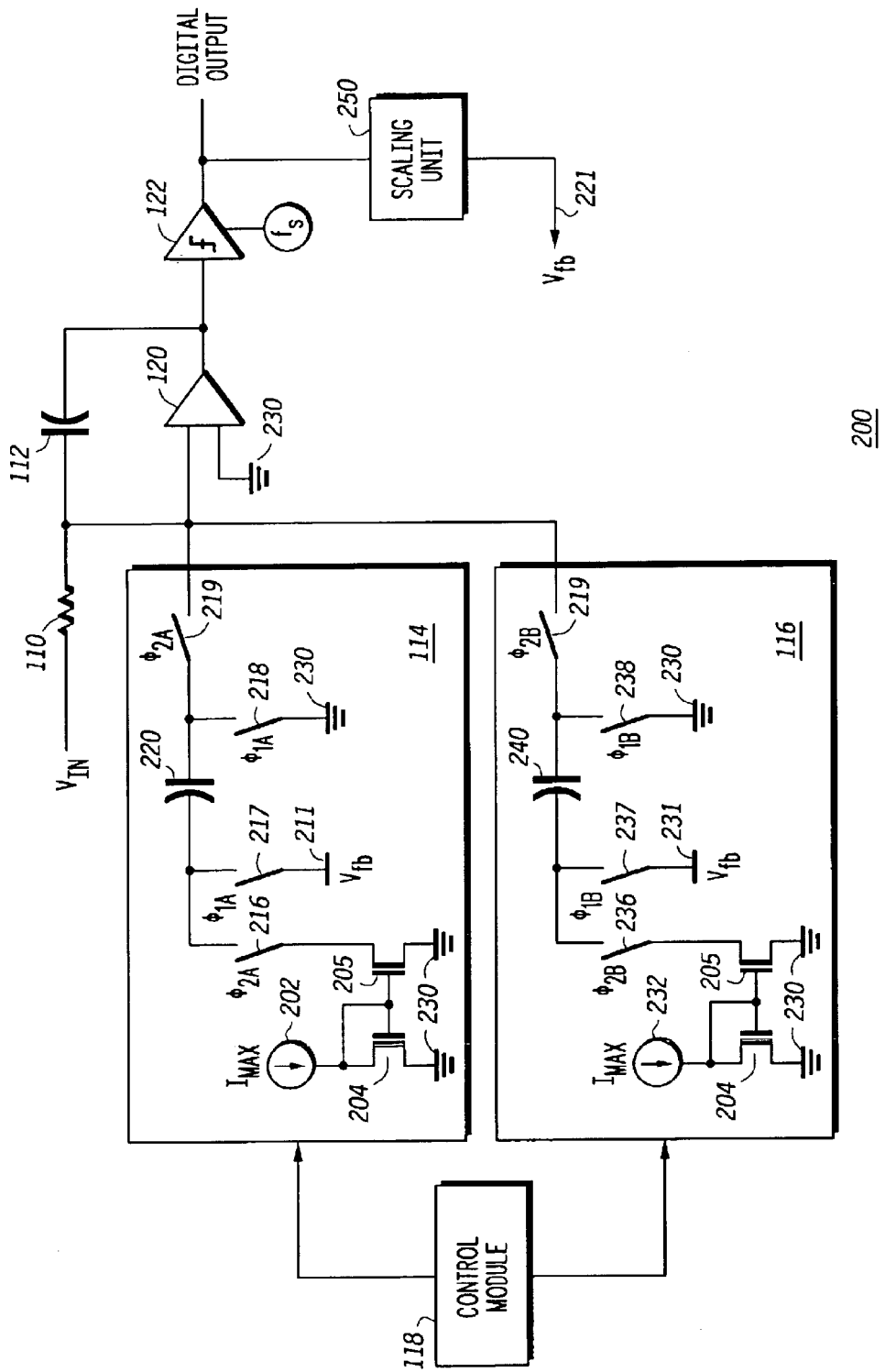
FIG. 2 is a block diagram and schematic providing a more detailed view of portions of FIG. 1.

FIGS. 1 and 2 illustrate a Sigma-Delta Modulator 100, utilizing Discrete-Time-Feedback-Modules 114 and 116, which through the operation of the control module 118 (shown in FIG. 1) samples and integrates a digital Feedback Signal 124 to produce an analog output. More specifically, the Sigma-Delta Modulator 100 is a specialized filtering apparatus, where its filter is formed by the combination of the Discrete-Time-Feedback-Modules 114 and 116, resistor 110, integration storage device 112, amplifier 120 and controller 118 to filter the Feedback signal 124, and the input signal $V_{IN}$ and to produce an output signal for the signal conditioner 122. Referring to FIG. 1 the Modulator 100 is comprised of an input voltage source Vin which is provided to a resistor 110. The other side of resistor 110 is connected to a first input node of the amplifier 120. An integration storage device (e.g. a capacitor) 112 is connected between the first input node of the amplifier 120 and the output of the amplifier. The output of amplifier 120 also connects to the input of a signal conditioner (e.g. a comparator) 122, whose output is the signal labeled Digital Output and is a signal that represents a digital stream of converted data. The digital output is also used as a Feedback Signal 124 to the sample inputs of the discrete-time-feedback-modules. Amplifier 120 also comprises a second input that is connected to a reference signal such as ground 130. Switches inside the discrete-time-feedback-modules 114 and 116 are set by the control module 118 to determine the operation of the Modulator 100.

During operation of the Sigma-Delta Modulator 100, discrete-time-feedback-module 114 samples the Feedback Signal 124 and stores a stored charge as the result. This result is later fed, also referred to as integrated, on to the integration storage device 112 through the amplifier 120. Because Modules 114 and 116 contain current-limiting circuitry, the output of amplifier 120 can be a substantially non-slewing amplifier that is able to accurately track the integration sample at all times without slewing designed in as with prior modulators. Such a design guarantees that: (1) the integrated input signal is a true linear representation of the input signal, (2) the feedback signal being integrated from any one of the feedback modules does not flow out onto any of the other connections except for the integration storage device, and (3) allows a power-efficient design of the operational amplifier 120. During a portion of the time that the sampled result of module 114 is being fed into the integration storage device 112, the discrete-time-feedback-module 116 will sample the Feedback Signal 124 and store the result, which will then also be fed to the integration device 112 through the amplifier 120. This sampling and integrating activity will continue on an ongoing basis.

Like FIG. 1, FIG. 2 is a Sigma-Delta Modulator 200 comprising an input voltage source Vin which goes to resistor 110, and thence to the integration device 112 and the first input node of amplifier 120. Again, the output of amplifier 120 is fed to a signal conditioner (comparator) 122, whose output is the digital signal stream of the modulator. Scaling of the digital stream by scaling unit 150 (which may be negative) gives the Feedback Signal Vfb 221. This Feedback Signal Vfb 221 is provided to the discrete-time-feedback-modules 114 and 116. In FIG. 2 the discrete-time-feedback-modules are represented in more detail.

The discrete-time-feedback-module 114 comprises a sample storage device (capacitor) 220. The Feedback Signal 221 is provided to the sample inputs of the discrete-time-feedback-module 114 and is connected to one side of the storage capacitor 220 during a time when switches 217 and 218 are closed by the control Module 118 (in FIG. 1). After a time sufficient for the sample storage device 220 to acquire a sample, switches 217 and 218 are opened by the control module 118 and switches 216 and 219 are closed. When switches 216 and 219 are closed, the Module 114 is in an integration mode, or an integration time. During the integration time the stored sample charge on capacitor 220 is integrated by the amplifier and the integration storage device 112. This integration activity may be interrupted by the opening and subsequent re-closing of switches 216 and 219 to permit other functions such as auto-zeroing of the amplifier to take place.

The discrete-time-feedback-module 116 comprises a sample storage device (capacitor) 240. The Feedback Signal 221 is provided to the sample inputs of the discrete-time-feedback-module 116 and is connected to one side of the storage capacitor 240 during a time when switches 237 and 238 are closed by the control Module 118 (in FIG. 1). After a time sufficient for the sample storage device 240 to acquire a sample, switches 237 and 238 are opened by the control module 118 and switches 236 and 239 are closed. When switches 236 and 239 are closed, the Module 116 is in an integration mode, or an integration time. During the integration time the stored sample charge on capacitor 240 is integrated by the amplifier and the integration storage device 112. This integration activity may be interrupted by the opening and subsequent re-closing of switches 236 and 239 to permit other functions such as auto-zeroing of the amplifier to take place.

During a portion of the integration time of Module 114, the Module 116 will sample the feedback voltage 221 by closing switches 237 and 238. This sampling period will store a sample on sample storage device 240 based on the Feedback Signal 221. Note that although sampling is done independently (only one sample storage device 220 or 240 may acquire a sample at a time) both sample storage devices 220 and 240 may be in integration mode at the same time if the control module 118 sets switches appropriately (i.e. switches 216, 219, 236 and 239 are closed, switches 217, 218, 237 and 238 are open). When the integration activity of discrete-time-feedback-module 114 is completed, at a later time switches 216 and 219 will again be opened by the control module 118 while discrete-time-feedback-module 116 will continue to perform an integration operation. The integration operation of Module 116 may also be interrupted by the control module to permit other functions such as auto-zeroing of the amplifier to occur. If required, this interruption is effected by the opening of switches 236 and 239.

During the integration periods of discrete-time-feedback-module 114 the amount of current permitted to be integrated at any instant is predetermined and controlled by the circuitry comprising the current source 202 and transistors 204 and 205. These components limit the discharge of capacitor 220 by restricting the flow of current to or from the integration device 112 whenever switches 216 and 219 are closed and switches 217 and 218 are open. By limiting the current through the capacitor 220, the amplifier 120 can accurately track its input without slewing. As a result, the output of the amplifier 120 will be able to amplify the signal on its first input node in a linear manner when the input signal is being integrated. Furthermore, any signal designated for 112 does not leak out onto any other connected entity. This allows the integrating amplifier 120 to be designed with lower peak output drive capabilities than would be otherwise necessary if current-limiting circuitry were not included. Lowering the peak output drive of amplifier 120 reduces the overall power consumption of the modulator, as well as permitting the amplifier to be physically smaller. Both of these are advantageous features. Additional discrete-time-feedback-modules such as 116 in FIGS. 1 and 2 have similar current limiting circuitry represented by current source 222 and transistors 224 and 225.

FIGS. 3 through 6 are timing diagrams, each describing different possible modes of operation of the disclosure. Time intervals are represented horizontally in sequence, and identified by the labels TP1–TP6 (Time Period 1–6) shown at the top of each diagram. During each Time Period, a specific action will be undertaken by some portion(s) of the Sigma Delta Modulator. Timing Diagrams 3–6 display information describing each action being executed by a functional block of the Sigma Delta Modulator as a horizontal sequence, with no more than one action occurring per functional block in a single Time Period. Some actions can extend for a duration of more than one Time Period. In particular, integration activities are permitted to occur over multiple time periods. If integration samples are taken multiple times during an integration activity, each sample will be indicated by a unique number in upper right-most area of the diagram pertaining to that functional block and Time Period.

FIGS. 3–6 are timing diagrams showing specific methods of operation of the Sigma-Delta Modulator of FIGS. 1 and 2. Each timing diagram illustrates the state of two discrete-time-modules, such as discrete-time-modules 114 and 116, during time periods TP1 through TP6. The discrete-time-modules in FIGS. 3–6 are labeled Module 1 and Module 2. During each time period, Module 1 and Module 2 will be in a specific state. Signal conditioner 122 change output periodically, for example, only at the transition between time periods.

At time TP1 of FIG. 3, Module 1 is in a sample state as indicated by the word "SAMPLE". When in a sample state, a module is charging a sample storage device. At time TP2 of FIG. 3, Module 1 is in an integration state as indicated by the word "INTEGRATE". When in an integration state, a module is integrating its sample charge onto an integration device. In accordance with the present disclosure, a module may integrate its sampled charge over multiple time periods. The number of time periods over which a sampled charge is integrated is indicated by a sequential count indicating the number of time periods used to integrate specific sample charge. For example, the number 1 in parenthesis, at TP2 of Module 1, indicates that TP2 is the first time period during which the sample charge acquired at TP1 is being integrated; while the number 2 in parenthesis at TP3 of Module 1, indicates that TP2 is the second time period during which the sample charge acquired at TP1 is being integrated. A time period containing Xs indicates a time period for a Module that is not relevant to describing a specific mode of operation.

FIG. 3 illustrates a first mode of operation in accordance with the present disclosure. During the mode of operation illustrated in FIG. 3, Module 1 is in a sample state at TP1. In the embodiment illustrated in FIG. 1, the feedback signal is sampled during TP1. The sample charge acquired during TP1 is integrated over a period of time that includes three time periods TP2–TP4. During a specific time period, only a portion of the stored charge will be integrated onto the integration device. With respect to the embodiment of FIG. 1, the integration of the sample charge during TP2–TP4 modifies the integration signal (Digital Output). Integrating over multiple time periods is different than previous methods, which integrate over a period of time that is the same as the period of time for sampling. The longer integration period of time associated with integration, as illustrated in FIG. 3, is facilitated by slewing of the sample storage device as previously discussed.

At time TP3, simultaneous with Module 1 being in an integration state, Module 2 is in a sample state, followed by an integration period of time lasting three time periods TP4–TP6. Note that the time TP3 during which Module 2 is in a sample state is an overlapping subset of the period of time TP2–TP4 during which Module 1 is in an integration state. Even though the charge from Module 1 has not been completely integrated at time TP3, the earlier, partial, information at the integration signal obtained by sampling with Module 2 at time TP3 can be used to improve the overall performance of the sigma-delta converter.

The sampling/integration period sequence repeats for both Module 1 and Module 2, with Module 1's next sample period being at TP5. In this manner, sampled charge is integrated onto an integration device, with the total amount of charge being integrated by a specific module being controlled by the slew on the sample storage device. If it is desirable to integrate charge at a greater rate, additional discrete-time-modules can be added.

FIG. 4 illustrates another mode of operation in accordance with the present disclosure that is similar to the mode of operation described with reference to FIG. 3. The mode of operation varies in that an auto-zeroing of the amplifier is supported. Specifically, the mode of operation illustrated in FIG. 4 removes one of the three integration time periods for each module based upon the auto-zeroing of the amplifier. Therefore, Module 1 is integrated over a period of time from TP2 to TP4, however, the actual integration only occurs during the time periods TP2 and TP4. At time TP3, the sample storage device maintains its charge for integration during a subsequent integration time period (TP4). Module 2 operates in a similar manner as Module 1 to support auto-zeroing.

Figure 5:
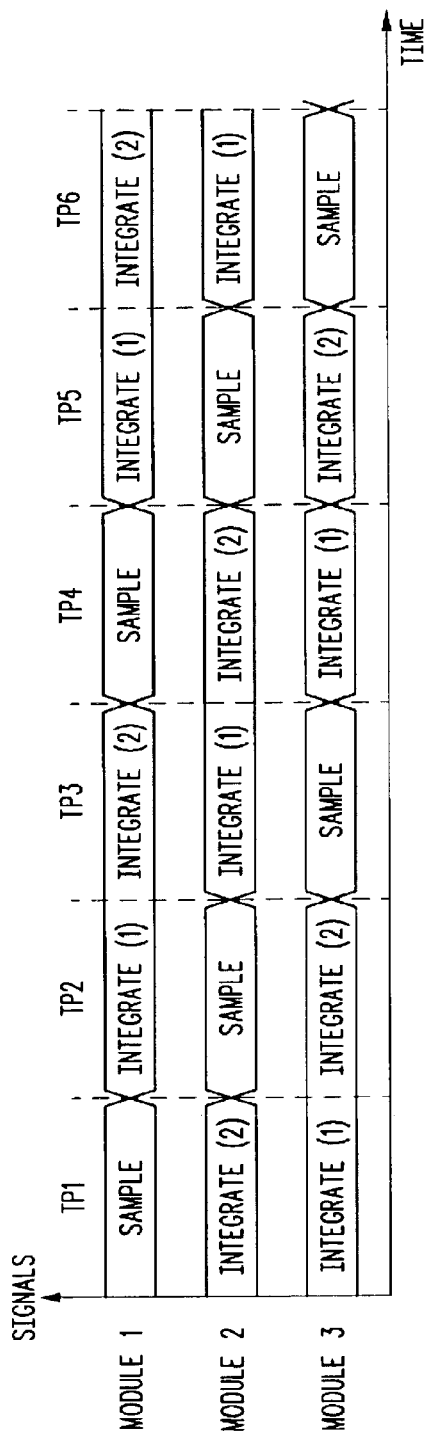

FIG. 5 illustrates a mode of operation where three discrete-time-modules are used. The effect of this mode of operation is for a sample to be obtained at each time period.

Figure 6:
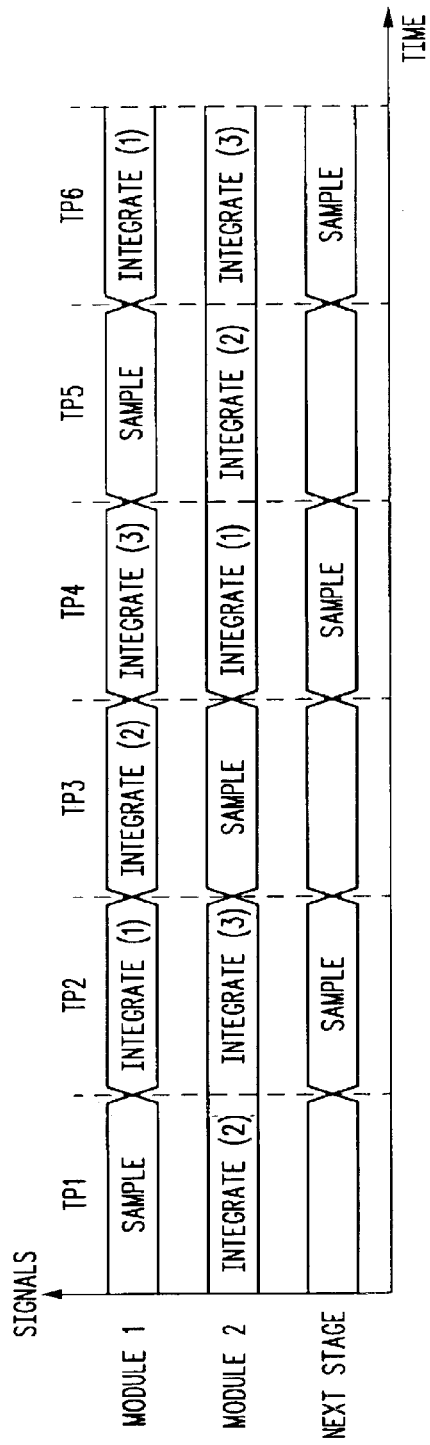

FIG. 6 illustrates yet another possible variety of overlapping integration. In this example, integration samples by a subsequent stage are not taken at every possible opportunity, but rather only when sample information from both discrete-time-feedback-modules are available. That is, samples by a subsequent stage are taken only when integration activities are overlapped on Module 1 and Module 2. For example, as illustrated in FIG. 6, when module 1 is in a sample state at time TP1, and Module 2 is in a sample state at time TP 2, both modules are integrating at time TP3. Therefore, the subsequent stage can sample at time TP3. Such a sampling and integration scheme can be useful to allow integration over long periods of time (e.g. 3 phases) while maintaining the same next stage sampling rate.

Figure 7:
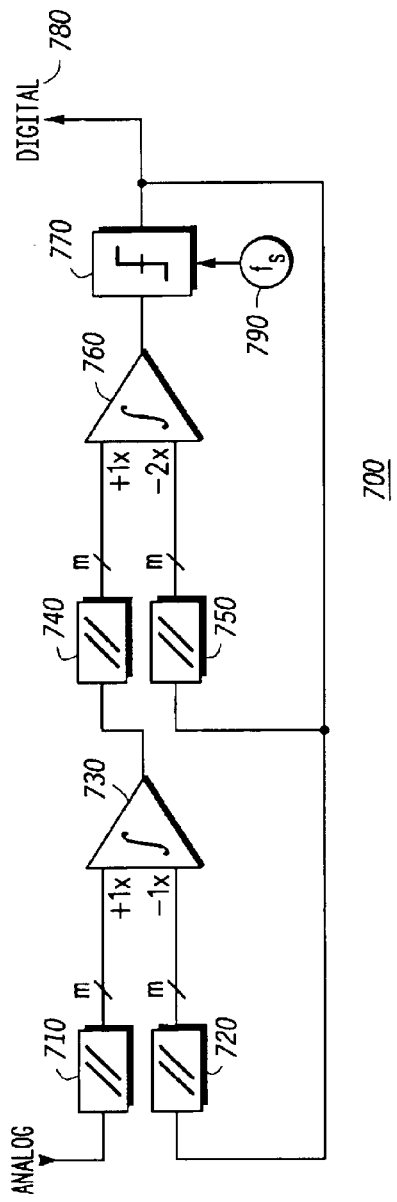
FIG. 7 is a block diagram showing a $2^{nd}$-order modulator utilizing the technique of the present disclosure with a discrete-time analog input.

FIG. 7 shows a block diagram of a multi-order (in this illustration it is a second-order) Sigma-Delta Modulator configuration. This embodiment is comprised exclusively of discrete-time inputs, which are generated through overlapping integration units 710 and 720, each of which may function as described in FIGS. 1–6. Note that each overlapping integration unit such as 710 and 720 correspond to discrete-time-modules 114 and 116 of FIG. 1, with the signal labeled Analog being sampled instead of the Feedback Signal 124. The overlapping integration units 710 and 720 pass their samples to the integration unit 730, the output of which is further sampled by an additional overlapping integration unit 740. The output of unit 740, along with information from an additional overlapping integration unit 750 is integrated by integration element 760. The output of 760 is an input to a signal conditioning device (comparator) 770, which outputs a digital binary stream 780. The rate of this data stream from 770 is controlled by a strobe signal from device 790. This data stream 780 is also used as an input to overlapping integration units 720 and 750.

Figure 8:
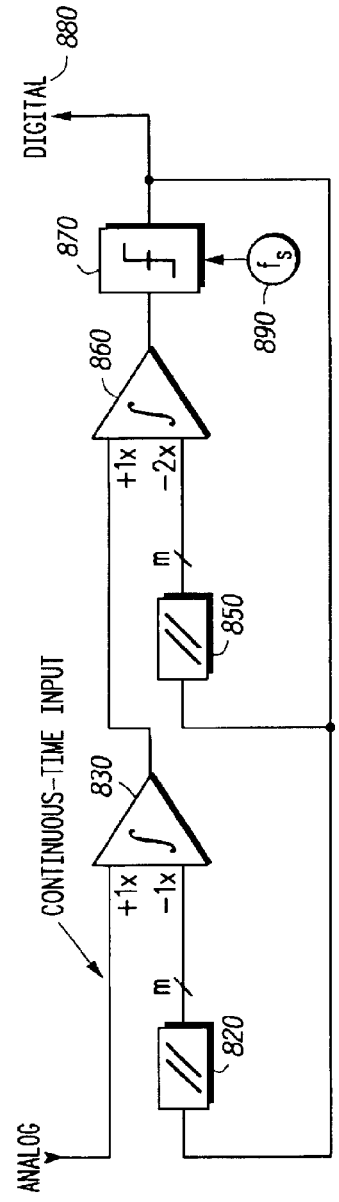
FIG. 8 is a block diagram showing a $2^{nd}$-order modulator utilizing the technique of the present disclosure with continuous-time analog input.

FIG. 8 shows another block diagram of a multi-order (in this illustration it is a second-order) Sigma-Delta Modulator configuration. This embodiment is comprised of both continuous-time and discrete-time inputs. In this instantiation integrator 830 is comprised of an input which receives an analog signal and an input which receives a discrete-time signal (via overlapping integration unit 820). The output of integrator 830 becomes the continuous-time input to a second stage of the modulator (integrator 860) which is comprised of inputs which also receive analog and discrete-time signals. The analog input to integrator 860 comes from the output of integrator 830 while the discrete-time signal is from overlapping integration unit 850. The output of integrator 860 is an input to signal conditioner 870. Signal conditioner 870 outputs a digital binary stream. The rate of this data stream from 870 is controlled by a strobe signal from device 890. This data stream 880 is also used as an input to overlapping integration units 820 and 850.

In summary it should be apparent from a review of the foregoing disclosure that various advantages can be achieved by using multiple current-limited discrete-time-feedback-modules in a sigma-delta modulator and overlapping the integration of their sampled information. By limiting the current, the design of the system amplifier can be made smaller, thereby reducing power consumption and size. Additionally, by overlapping and repeatedly sampling the information acquired by the discrete-time-feedback-modules, accuracy is improved.

In the preceding detailed description of the figures, reference has been made to the accompanying drawings which form a part thereof, and in which is shown by way of illustrations specific embodiments in which the invention may be practiced. These embodiments are described in sufficient detail to enable those skilled in the art to practice the invention, and it should be understood that other embodiments may be utilized and that logical, mechanical, chemical, and electrical changes may be made without departing from the spirit or scope of the invention. To avoid detail not necessary to enable those skilled in the art to practice the invention, the description may omit certain information known to those skilled in the art. Furthermore, many other varied embodiments that incorporate the teachings of the invention may be easily constructed by those skilled in the art. According, the present disclosure is not intended to be limited to the specific form set forth herein, but on the contrary, it is intended to cover such alternatives, modifications, and equivalents as can be reasonably included within the spirit and scope of the invention. The preceding detailed description is therefor not to be taken in a limiting sense and the scope of the present disclosure is defined only by the appended claims.

What is claimed is:

1. A method comprising:
   sampling a signal during time period T1 to acquire a first stored charge at a first storage device;
   integrating the first stored charge during time period T2 to modify the signal, wherein time period T2 is after time period T1; and
   sampling the signal during time period T3 to acquire a second stored charge at a second storage device, wherein T3 is a time subset of T2.

2. The method of claim 1 further comprising:
   integrating a first portion of the first stored charge during time period T4; and
   integrating a second portion of the first stored charge during time period T5, wherein T3 immediately precedes T5 and follows T4, and T3, T4 and T5 are time subsets of T2.

3. The method of claim 2 further comprising:
   integrating a third portion of the first stored charge during T3.

4. The method of claim 2 further comprising:
   autozeroing an amplifier that facilitates integrating during T3.

5. The method of claim 2, wherein integrating the first portion of the first stored charge during time period T4 comprises T4 being less than a discharge time of a device storing the first stored charge.

6. The method of claim 1 further comprising:
   integrating the second stored charge during time period T4 to modify the integration signal, wherein T4 at least partially overlaps with T2.

7. The method of claim 1 further comprising:
   integrating a first portion of the first stored charge during time period T3;
   integrating a second portion of the first stored charge during time period T4, wherein T3 is immediately adjacent to T4, and T4 is a time subset of T2.

8. The method of claim 7 further comprising:
   sampling the signal during time period T4 to acquire a third stored charge on a third storage device.

9. The method of claim 8 further comprising:
   sampling the signal during time period T5 to acquire a fourth stored charge at the first storage device;
   integrating a first portion of the third stored charge during time period T5; and
   integrating a second portion of the second stored charge during time period T5.

10. A filtering apparatus comprising:
    an amplifier comprising a first input, a second input, and an output;
    a first discrete time feedback module comprising a feedback input, an output coupled to the first input of the amplifier, a capacitive element, and current limiting circuitry to limit the discharge of the capacitive element; and
    a second discrete time feedback module comprising a feedback input coupled to the feedback input of the first discrete time feedback module, and an output coupled to the first input of the amplifier, a capacitive element, and a current limiting circuitry to limit the discharge of the capacitive element.

11. The filtering apparatus of claim 10 further comprising the feedback input of the first discrete time feedback module being coupled to the output of the amplifier, and the feedback input of the second discrete time feedback module being coupled to the output of the amplifier.

12. The filtering apparatus of claim 10 further comprising:
    a control module having a first output coupled to a first control input of the first discrete time feedback module to facilitate sampling of the feedback input of the first discrete time feedback module during a first time period, and a second output coupled to a first control input of the second discrete time feedback module to facilitate sampling of the feedback input of the second discrete time feedback module during a second time period.

13. The filtering apparatus of claim 12 further comprising:
    an integration storage device coupled to the output of the amplifier, wherein the first output of the control module coupled to the first control input of the first discrete time feedback module further facilitates an integration at the integration device, and the second output of the control module coupled to the first control input of the second discrete time feedback module further facilitates the integration at the integration device.

14. The filtering apparatus of claim 10 further comprising:
    a control module having a first output coupled to a first control input of the first discrete time feedback module to facilitate sampling of the feedback input of the first discrete time feedback module during a first time period, and the first output coupled to a first control input of the second discrete time feedback module to facilitate sampling of the feedback input of the second discrete time feedback module during a second time period.

15. The filtering apparatus of claim 14 further comprising:
    an integration storage device coupled to the output of the amplifier, wherein the first output of the control module coupled to the first control input of the first discrete time feedback module further facilitates an integration at the integration device.

16. The filtering apparatus of claim 10 wherein the amplifier is a substantially non-slewing amplifier.

17. A method comprising:
    placing a first discrete time feedback module in a sampling state to sample a signal that is to be integrated at an integration device, wherein the sampling state has a first time duration;
    placing the first discrete time feedback module in an integration state to modify the signal, wherein the integration state has a second time duration that is longer than the first time duration.

18. The method of claim 17, wherein the second time duration is an integer multiple of the first time duration.

19. The method of claim 18, wherein the integer multiple is 2.

20. The method of claim 18, wherein the integer multiple is 3.

21. The method of claim 17 further comprising:
    placing a second discrete time feedback module in a sampling state to sample the signal when the first discrete time feedback module is in the integration state.

22. The sigma delta modulator comprising:
    an amplifier comprising a first input;
    a node to receive a signal that is to be integrated;
    N sampling modules, where N is an integer greater than 1, each of the N sampling modules comprising an input coupled to the node,
an output connected to the first input,
and a control input;
a controller having N outputs, each one of the N outputs coupled to the control input of one of the N sampling modules, wherein the controller is to provide each one of the N sampling modules a control signal having a sampling phase and a non-sampling phase, where the sampling phase of any one of the N sampling modules is a proper subset of the non-sampling phase of any one of the other N−1 sampling modules.

23. The sigma delta modulator of claim 22, wherein at least a portion of the non-sampling phase of the control signal comprises an integration phase, where the integration phase of any one of the N sampling modules has a portion which does not completely overlap the integration phase of any one of the other N−1 sampling modules.

24. The sigma delta modulator of claim 23, wherein the non-sampling phase and the integration phase of the control signal are periodic.

25. A method comprising:
sampling a signal during time period T1 to acquire a first stored charge at a first storage device;
coupling the storage device to an integrator; and
limiting a discharge of the storage device when coupled to the integrator.

26. The method of claim 25 wherein limiting the discharge of the storage device occurs when the storage device is coupled to the integrator during a second time period.

27. The method of claim 25, wherein limiting the discharge includes limiting the discharge based upon a current source current.

* * * * *